(12) United States Patent
Guenley

(10) Patent No.: US 9,556,511 B2
(45) Date of Patent: Jan. 31, 2017

(54) PLATING STACK TO CONDITION A BONDING SURFACE

(71) Applicant: Materion Corporation, Mayfield Heights, OH (US)

(72) Inventor: William Guenley, Albuquerque, NM (US)

(73) Assignee: MATERION CORPORATION, Mayfield Heights, OH (US)

( * ) Notice: Subject to any disclaimer, the term of this patent is extended or adjusted under 35 U.S.C. 154(b) by 255 days.

(21) Appl. No.: 14/205,413

(22) Filed: Mar. 12, 2014

(65) Prior Publication Data

US 2014/0262768 A1    Sep. 18, 2014

Related U.S. Application Data

(60) Provisional application No. 61/791,936, filed on Mar. 15, 2013.

(51) Int. Cl.
| | |
|---|---|
| C23C 14/34 | (2006.01) |
| H01J 37/34 | (2006.01) |
| C25D 5/10 | (2006.01) |
| C25D 5/36 | (2006.01) |
| C25D 7/00 | (2006.01) |
| C25D 7/04 | (2006.01) |

(52) U.S. Cl.
CPC .............. *C23C 14/3407* (2013.01); *C25D 5/10* (2013.01); *C25D 5/36* (2013.01); *C25D 7/00* (2013.01); *C25D 7/04* (2013.01); *H01J 37/3417* (2013.01); *H01J 37/3435* (2013.01); *H01J 37/3491* (2013.01)

(58) Field of Classification Search
CPC .............. C25D 5/10; C25D 5/36; C25D 7/00; C23C 14/3407; H01J 37/3417; H01J 37/3435; H01J 37/3491
USPC .............. 204/298.12, 298.13, 298.21, 298.22
See application file for complete search history.

(56) References Cited

U.S. PATENT DOCUMENTS

| | | | |
|---|---|---|---|
| 3,669,851 A | 6/1972 | Garvey | |
| 5,693,203 A * | 12/1997 | Ohhashi | C23C 14/3407 204/298.12 |
| 2007/0062809 A1* | 3/2007 | Nolette | C23C 14/3407 204/298.12 |
| 2011/0168555 A1 | 7/2011 | Nolette et al. | |

FOREIGN PATENT DOCUMENTS

WO    WO 2012/146302 A1    11/2012

OTHER PUBLICATIONS

International Search Report for PCT/US2014/023910 dated Jul. 21, 2014.

* cited by examiner

*Primary Examiner* — Rodney McDonald
(74) *Attorney, Agent, or Firm* — Richard M. Klein; Fay Sharpe LLP

(57) ABSTRACT

A rotary sputtering target assembly and method of making the same including a target and a backing tube having a plated bonding surface. The backing tube and the target are bonded together along the plated bonding surface.

18 Claims, 2 Drawing Sheets

PLATING STACK TO CONDITION A BONDING SURFACE

CROSS REFERENCE TO RELATED PATENTS AND APPLICATIONS

This application claims priority to and the benefit of the filing date of U.S. Provisional Patent Application Ser. No. 61/791,936, filed Mar. 15, 2013, which application is hereby incorporated by reference.

BACKGROUND

The present exemplary embodiment relates to rotary sputtering targets and related assemblies. It finds particular application in conjunction with a rotary target assembly including a target material supported by a backing tube, and will be described with particular reference thereto. However, it is to be appreciated that the present exemplary embodiment is also amenable to other like applications.

Sputter depositions are reproducible and are also simple for process automation. High value materials such as gold, platinum and other alloys of precious metals, routinely find employment in thin film coatings using planar sputtering or evaporation deposition techniques. These techniques have limitations with respect to yield, speed of deposition and in cooperative in-line deposition of multi-layer stacks.

Rotary sputtering targets have been shown to improve the sputtering process. By rotating the sputtering material, the target material is sputtered in a more continuous uniform fashion than when compared to planar targets. Rotary sputtering targets are typically formed in a cylindrical shape. Using high value materials in cylindrical rotary systems as monolithic or heavy wall sleeves is typically prohibitively expensive. Accordingly, it is common to support a thinner sleeve of target material with a backing tube of a less expensive and/or stronger material. A backing tube provides added support while allowing more of the target material to be utilized before replacement.

A typical backing tube is constructed of a material that can withstand the sputtering process while retaining its shape. The backing tube supports the rotary sputtering target thereby reducing excess flexing of the target material. Another advantage of using a backing tube is that cooling fluid can be passed through the backing tube to cool the target material during the sputtering process. For cooling to be effective it is important that there is sufficient thermal contact between the cooling fluid and the rotary sputtering target material. Current technology for the assembly of rotary sputtering targets attach the backing tube in such a manner as to prevent any gap between the inner surface of the rotary sputtering target and the outer surface of the backing tube to ensure sufficient thermal contact between the backing tube and the target material.

There exist various techniques for attaching the rotary sputtering target to the backing tube. One such technique is to cast the rotary sputtering target onto the backing tube. This in essence creates a complete structure that is very rigid. However, casting is only feasible when using a castable rotary sputtering target material. Casting directly on the backing tube has its drawbacks. For example, casting often results in variable grain size and has an inherent porosity that is created from the volume changes of the liquid to solid transition. These variables and defects are detrimental to a target system.

Another technique for attaching the rotary sputtering target to the backing tube is by use of a bonding material. An adhesive or metal alloy is placed between the inner surface of the rotary sputtering target and the outer surface of the backing tube. This creates a strong bond between the two surfaces and assists in cooling transfer. However, care must be taken when flowing the adhesive between the rotary sputtering target and the backing tube to ensure adequate bonding strength. Reuse of the backing tube is a laborious process, as it is difficult to remove the remaining target material from a sufficiently secure bond. An improved bonding method and assembly is described in U.S. Patent Publication No. 2012/0006680, which is hereby incorporated by reference herein in its entirety.

While the method and assembly set forth in US 2012/0006680 offers an improvement over existing methods, there is still room for further improvement in both the method and the assembly.

BRIEF DESCRIPTION

In accordance with one aspect, a rotary sputtering target assembly comprises a target, and a backing tube having a plated bonding surface. The backing tube and the target are bonded together along the plated bonding surface.

The backing tube can include a stainless steel body. The stainless steel body can include a plated material on a radially outer surface thereof. The plated material can include a plate stack comprising a negative copper plating, a positive copper plating, and a silver plating. The silver plating can be the radially outermost layer of the plate stack. The plated material can be formed by activating the stainless steel with woods nickel, placing the backing tube in an anodic copper environment, activating the backing tube by making it cathodic, and cathodically plating copper. The copper can be the radially outermost layer of a plate stack. A bonding material can bond the backing tube to the target. The bonding material can include solder. The solder can include at least one of the following: indium based, tin based, antimony based, or lead based solders.

In accordance with another aspect, a method of making a rotary target assembly comprises constructing a backing tube body, plating a surface of a backing tube body, assembling a target over the backing tube body, and bonding the target to the plated surface of the backing tube.

The backing tube body can include a stainless steel body, and the plating a surface of the backing tube body can include plating a radially outer surface thereof. The plating can include plating a plate stack comprising a negative copper plating, a positive copper plating, and a silver plating. The plating can include plating a plate stack including activating the stainless steel with woods nickel, placing the backing tube body in an anodic copper environment, activating the backing tube body by making it cathodic, and cathodically plating copper. The bonding can include soldering the backing tube body to the target.

DETAILED DESCRIPTION

Figure 1:
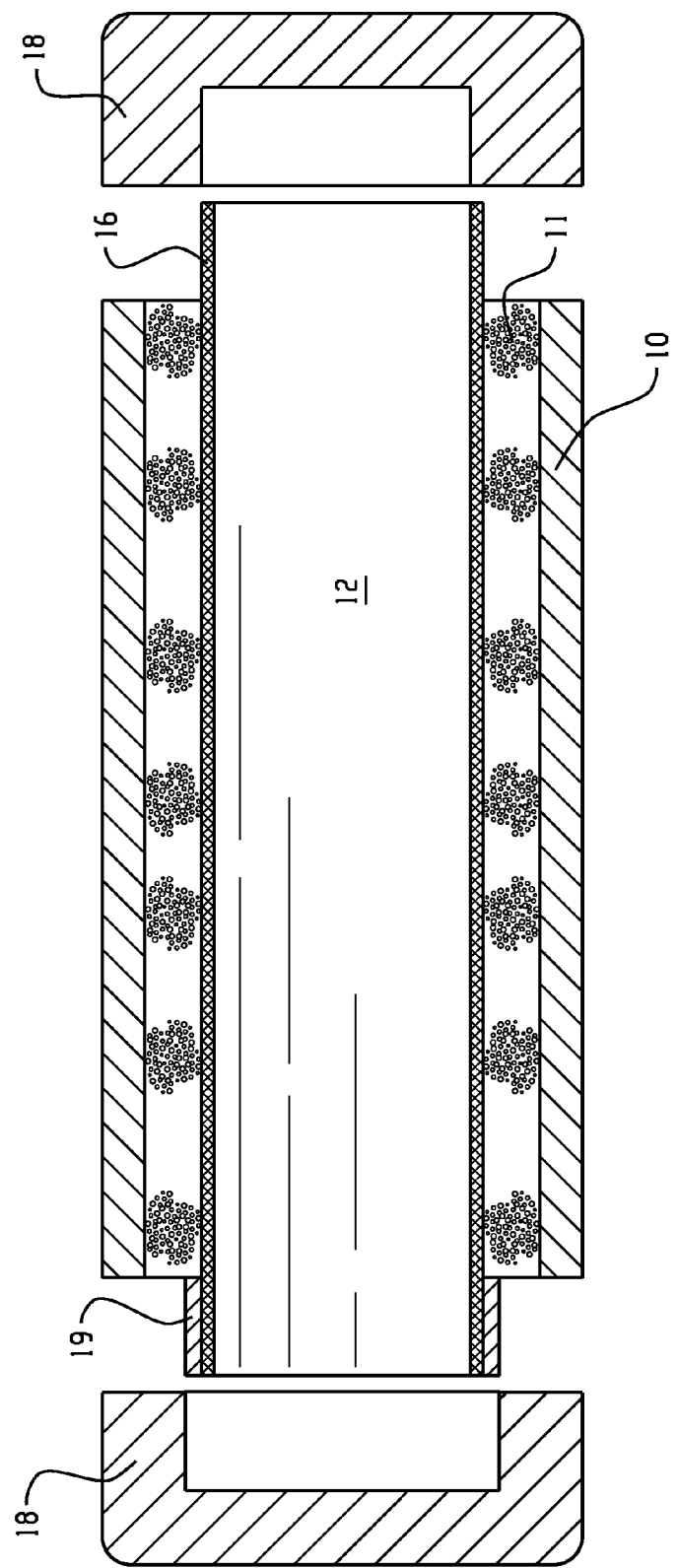
FIG. 1 is a partial cross-sectional view of an exemplary rotary sputtering target in accordance with the present disclosure.

Referring to FIG. 1, there is shown a rotary sputtering target bonded to a backing tube in accordance with the present disclosure. The target material 10 is bonded to the backing tube 12 by the bonding material 11. The bonding material 11 extends from the first end of the target material 10 in a continuous fashion to the second end. As will be described in more detail below, the backing tube 12 includes a plate stack 16 to condition the bonding surface (e.g., radially outer surface of the backing tube 12) for bonding to the target material 10. Also illustrated are end caps 18 that can be secured to the backing tube 12, such as by bonding. In some embodiments, a different radially outermost plated material can be provided at the terminal end of the backing tube for bonding with an end cap 18. This is represented by layer 19 in FIG. 1.

It should be appreciated that practically any material can be supplied as a rotary sputtering target material. Suitable rotary sputtering target materials include, but are not limited to, alloys, mixtures, pure metals, ceramics, oxides, nitrides, borides, carbides, fluorides and sulfides. In one embodiment, a metal target is sputtered by oxidizing or nitriding sputtered metal ions to deposit an oxide or nitride film layer of the desired composition. It is understood that these sputtering techniques do not constitute an exhaustive list of possible sputtering techniques and that particular sputtering techniques will depend on the sputtering target material and be known to those skilled in the art. Current systems employ rotary sputtering targets having a length from about 6" to 152", an inner diameter from about 2" to 6" and an outer diameter from about 4" to 9". It is understood that as sputtering systems change these dimensions are not intended to be limiting.

The bonding material 11 is used to bond the rotary sputtering target 10 to the backing tube 12. The bonding material generally has a high strength to weight ratio compared to the sputtering material, however this is not necessary in all applications. Suitable bonding materials include, but are not limited to solder type materials, bismuth type materials, foils, indium, indium/tin, silver/tin and similar alloys. The bonding material should be selected based on the material properties of the rotary target and the backing tube. In one embodiment the bonding material not only bond the rotary sputtering target to the backing tube, but also provides a vacuum seal. In yet another embodiment the bonding material forms a seal sufficient to resist the pressure of the cooling fluid during the sputtering process.

The backing tube material is generally selected from a material having a high strength and a low cost. The backing tube must be constructed of a material, and have a thickness, suitable to support the weight of the rotary sputtering target. Furthermore, the backing tube should be vacuum compatible so as to not go through a phase change in systems utilizing vacuum chambers.

Generally, backing tubes are constructed from a non-magnetic material so as to not affect the magnetic field often used in the sputtering process. Suitable backing tube materials include, but are not limited to stainless steel, aluminum and titanium. The backing tube will generally have size dimensions similar to those of the rotary sputtering target. The backing tube may extend in length beyond the rotary sputtering target for attachment to the sputtering system. Additionally, the outer diameter of the backing tube should be close to the inner diameter of the rotary sputtering target. In one embodiment, the difference between the outer diameter of the backing tube and the inner diameter of the rotary sputtering target is less than 3 mm. In another embodiment, the difference between the outer diameter of the backing tube and the inner diameter of the rotary sputtering target is less than 1 mm.

It will be appreciated that due to the wide range of target materials, backing tube materials, and bonding materials, care must be taken to ensure that the materials will adequately bond together. In the past, for example, it was important to select a backing tube material that would allow the bonding material to create a sufficiently strong bond with the target material. For example, the wetting of solders (e.g., bonding material onto a substrate (e.g., backing tube) depends heavily upon the technique used and the surface condition and materials of both solder and substrate. Substrate materials such as stainless steel require activation via a variety of means including ultrasonic vibration, mechanical agitation, chemical activation (flux), and other methods. Not all of these methods are feasible depending upon the geometry of the part, especially along radial surfaces encountered in construction of rotary sputtering targets. The present disclosure overcomes this problem by presenting an easily wettable surface no matter the substrate material.

In accordance with the present disclosure the backing tube material can be chosen without the need to consider whether the bonding material will create a sufficiently strong bond between the backing tube material and the target material because the backing tube material is plated with one or more additional layers of material chosen to ensure a strong bond with the target material. As such, lower cost backing tube materials can be utilized.

Figure 2:
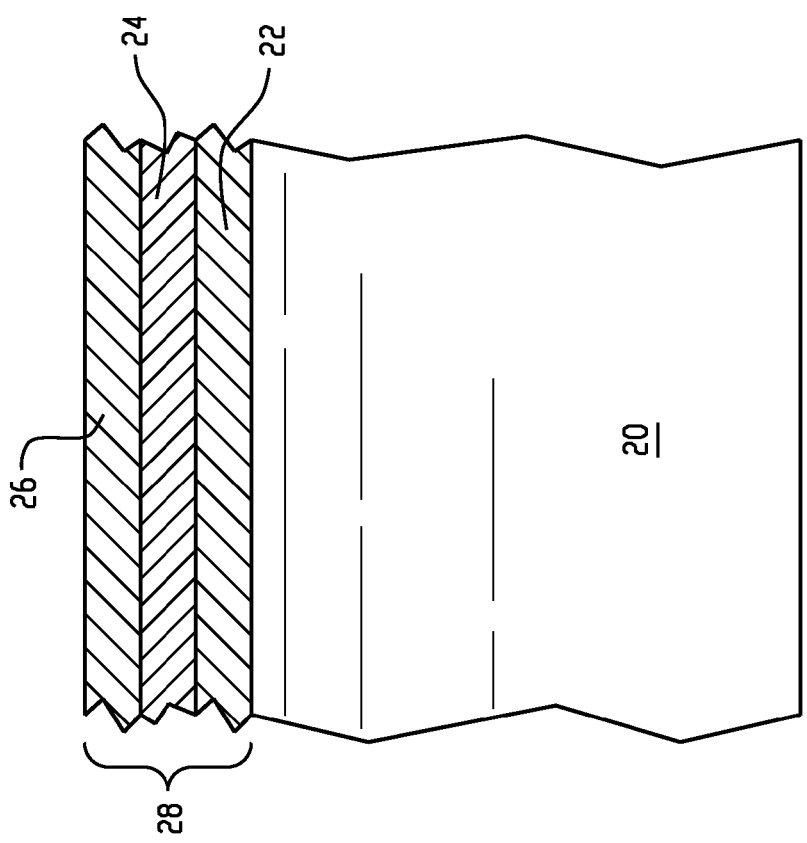
FIG. 2 is a partial cross-sectional view of a portion of an exemplary plate stack on a backing tube in accordance with the present disclosure.

The present disclosure sets forth plating a designed stack of materials onto a substrate (e.g., backing tube) via electroplating (or other process). With reference to FIG. 2, an example of a stack of materials can include, on a stainless substrate 20, a negative copper layer 22, a positive copper layer 24, and a silver layer 26. The silver top layer 26 is presented for bonding with another material (e.g., target material), such as gold or other suitable material. The use of this stack 28 facilitates transition from the substrate material (stainless steel) 20 to a material (silver 26) conducive to bonding with the target material while transitioning along materials (e.g., negative copper, positive copper) that adhere well to each other. The design of the stack 28 is used to achieve a surface material layer that is easily "wetted" by a solder used in bonding applications. It will be appreciated that this process can be used to prepare a backing tube for bonding with another surface, such as an end cap or a target. In some embodiments, a different material can be plated on the ends of the backing tube for bonding with the end caps, which are typically a different material than the target material.

Figure 3:
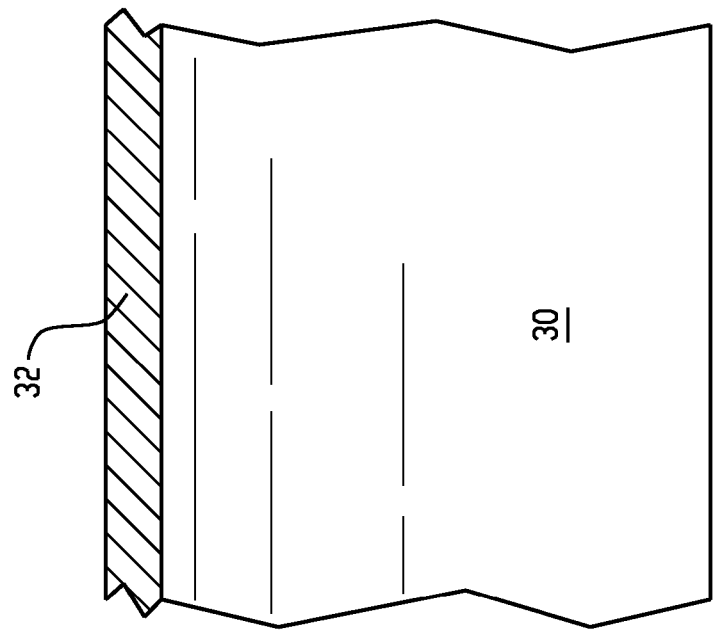
FIG. 3 is a partial cross-sectional view of a portion of another exemplary plate stack on a backing tube in accordance with the present disclosure.

In another exemplary embodiment, illustrated in FIG. 3, a stainless steel backing tube 30 is constructed and is then plated through a process including activating the stainless steel with woods nickel, placing the backing tube in an anodic copper environment, activating the backing tube by making it cathodic, and cathodically plating a copper layer 32.

In general, the plating processes described above are carried out after a backing tube is constructed, and before it needs to be pre-wet with solder for bonding to a target or other surface. It will be appreciated that the disclosed processes are useful in a wide variety of applications in addition to sputter targets.

The exemplary embodiment has been described with reference to the preferred embodiments. Modifications and alterations will occur to others upon reading and understanding the preceding detailed description. It is intended that the exemplary embodiment be construed as including all such modifications and alterations insofar as they come within the scope of the appended claims or the equivalents thereof.

The invention claimed is:

1. A rotary sputtering target assembly comprising:
   a target;
   a backing tube having a plate stack on a radially outer surface thereof; and
   a bonding material bonding the plate stack to the target;
   wherein the backing tube and the target are bonded together along the plated bonding surface;
   wherein the plate stack comprises a negative copper plating, a positive copper plating, and a silver plating; and
   wherein the rotary sputtering target assembly comprises from radially inward to radially outward in sequence the backing tube, the plate stack, the bonding material, and the target.

2. The rotary sputtering target assembly of claim 1, wherein the backing tube includes a stainless steel body.

3. The rotary sputtering target assembly of claim 1, wherein the silver plating is the radially outermost layer of the plate stack.

4. The rotary sputtering target assembly of claim 1, wherein the bonding material is solder.

5. The rotary sputtering target assembly of claim 4, wherein the solder includes at least one of the following: indium based, tin based, antimony based, or lead based solders.

6. The rotary sputtering target assembly of claim 1, further comprising at least one end cap bonded to the backing tube.

7. The rotary sputtering target assembly of claim 6, wherein a terminal end of the backing tube includes a plated material different than a remainder of the plate stack to which the target is bonded.

8. The rotary sputtering target assembly of claim 1, wherein the plate stack comprises from radially inward to radially outward in sequence the negative copper plating, the positive copper plating, and the silver plating.

9. The rotary sputtering target assembly of claim 8, wherein the plate stack consists of the negative copper plating, the positive copper plating, and the silver plating.

10. A method of making a rotary target assembly comprising:
    constructing a backing tube body;
    plating a radially outer surface of a backing tube body to form a plate stack thereon;
    assembling a target over the plate stack; and
    bonding the target to the plate stack with a bonding material;
    wherein the plate stack comprises a negative copper plating, a positive copper plating, and a silver plating; and
    wherein the rotary sputtering target assembly comprises from radially inward to radially outward in sequence the backing tube body, the plate stack, the bonding material, and the target.

11. The method of claim 10, wherein the backing tube body comprises stainless steel.

12. The method of claim 10, wherein the bonding includes soldering the backing tube body to the target.

13. The method of claim 10, further comprising bonding an end cap to the backing tube body.

14. The method of claim 10, wherein the plate stack comprises from radially inward to radially outward in sequence the negative copper plating, the positive copper plating, and the silver plating.

15. The method of claim 14, wherein the plate stack consists of the negative copper plating, the positive copper plating, and the silver plating.

16. A backing tube for a rotary sputter target assembly comprising:
    a stainless steel backing tube body having a radially outer surface;
    a plate stack on the radially outer surface;
    wherein the plate stack comprises a negative copper plating, a positive copper plating, and a silver plating; and
    wherein the plate stack comprises from radially inward to radially outward in sequence the negative copper plating, the positive copper plating, and the silver plating.

17. The backing tube of claim 16, wherein the plate stack is deposited via electroplating.

18. The backing tube of claim 16, wherein the plate stack consists of the negative copper plating, the positive copper plating, and the silver plating.

* * * * *